Figure 1A:
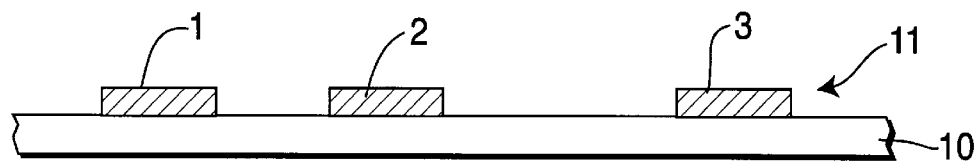

United States Patent

Sanson et al.

[11] Patent Number: 5,830,785
[45] Date of Patent: Nov. 3, 1998

[54] DIRECT MULTILEVEL THIN-FILM TRANSISTORS PRODUCTION METHOD

[75] Inventors: Eric Sanson; Nicolas Szydlo, both of Grenoble; Bernard Hepp, Sevres, all of France

[73] Assignee: Thomson LCD, Paris, France

[21] Appl. No.: 522,243

[22] PCT Filed: Mar. 15, 1994

[86] PCT No.: PCT/FR94/00278

§ 371 Date: Feb. 22, 1996

§ 102(e) Date: Feb. 22, 1996

[87] PCT Pub. No.: WO94/21102

PCT Pub. Date: Sep. 29, 1994

[30] Foreign Application Priority Data

Mar. 16, 1993 [FR] France .................................. 93 03012

[51] Int. Cl.⁶ .................................................. H01L 21/00
[52] U.S. Cl. .............................................. 438/158; 438/30
[58] Field of Search ................................... 437/40, 41, 51; 438/158, 30

[56] References Cited

U.S. PATENT DOCUMENTS

| 5,032,531 | 7/1991 | Tsutsui et al. | 437/51 |
| 5,238,861 | 8/1993 | Morin et al. | 437/51 |
| 5,299,289 | 3/1994 | Omae et al. | 359/95 |
| 5,320,973 | 6/1994 | Kobayashi | 434/40 |
| 5,455,182 | 10/1995 | Nishimoto et al. | 437/21 |

*Primary Examiner*—John Niebling
*Assistant Examiner*—Michael S. Lebentritt
*Attorney, Agent, or Firm*—Joseph S. Tripoli; Frederick A. Wein

[57] ABSTRACT

The present invention can be used to make integrated circuits on the same substrate as the active matrix owing to the possibility that it offers of connecting transistor gates to sources or drains of the same or other transistors, and thus be used in a "integrated drivers" technology. It is also possible to make different types of transistors and capacitances using this method, without adding any additional mask levels.

13 Claims, 6 Drawing Sheets

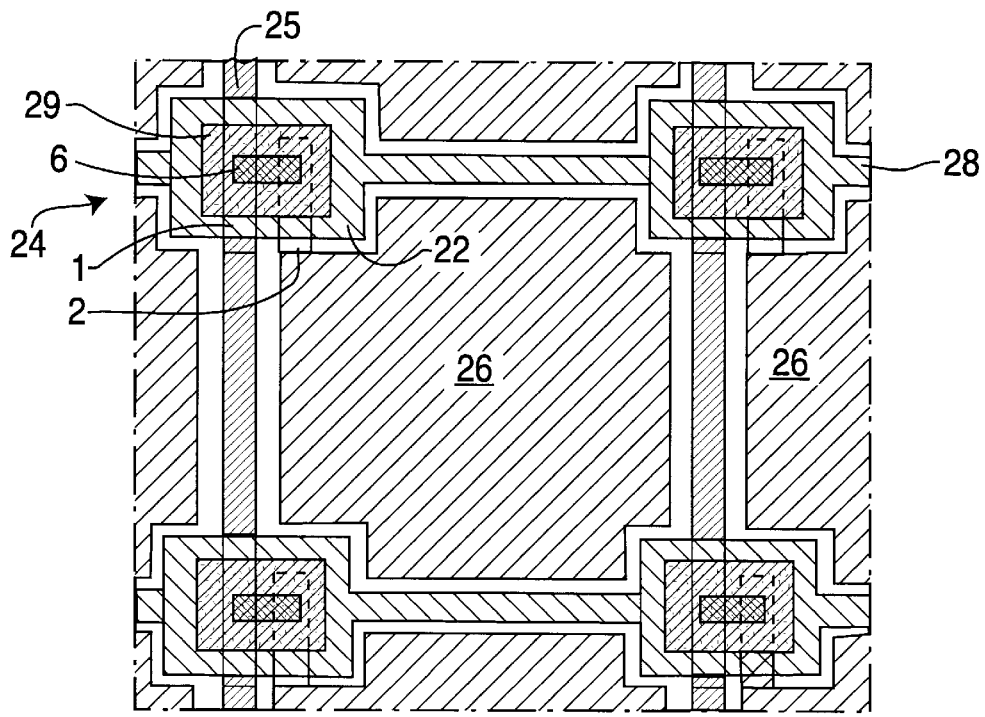
FIG. 2f
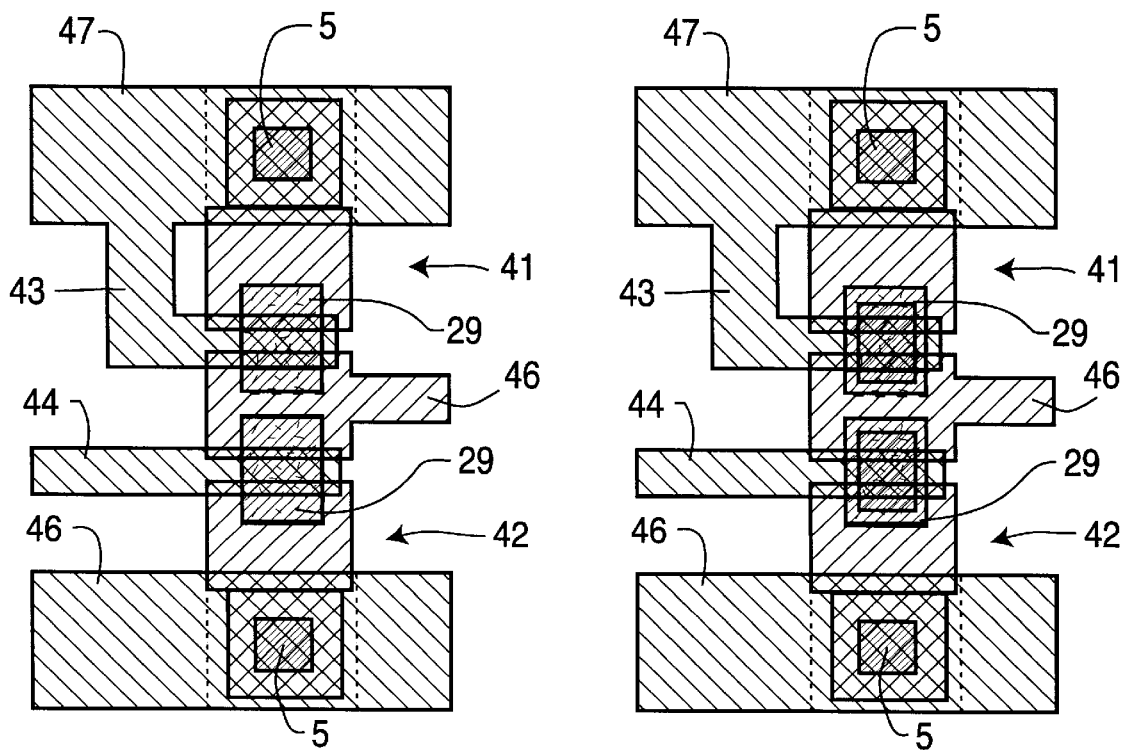
FIG. 2g   FIG. 2h

DIRECT MULTILEVEL THIN-FILM TRANSISTORS PRODUCTION METHOD

This invention relates to a method for producing direct multilevel thin-film transistors (TFTs) with a small number of mask levels, to form a contact between a transistor gate and the source or drain of the same or another transistor, and for use in producing flat liquid crystal screens, particularly on screens having integral electronic control circuit.

A liquid crystal screen consists of a number of liquid crystal cells laid out in a matrix and connected by connection rows or columns to the electronic control circuitry. A first support plate consists of a substrate containing a first set of electrodes, the control components for these electrodes, and addressing rows and columns (active matrix). The liquid crystal is contained between this plate and a second support plate forming the counter-electrode. Each pixel (picture element) thus formed works as an optical valve. Local modification of the transmission or reflection of light is obtained by using the electronic control circuitry to apply a voltage between an access contact on the plate and a contact on the counter-plate. This voltage creates an electric field between facing electrodes and activates the volume of liquid crystal located between the two electrodes which more or less changes the characteristics of the light passing through it.

In the case of active matrix screens, an active element with two terminations (diode) or three terminations (transistor) is associated with each pixel and with each row-column intersection. This type of screen may be manufactured using methods for producing active matrices composed of thin-film transistors. These transistors may have a direct multilevel structure, in other words the gate is above the source and drain with respect to the substrate, or may be reverse multilevel, when the gate is below the source and drain.

A direct multilevel structure is described in European patent application 82 783 "Method of manufacturing thin-film silicon transistors on insulating substrate" (F. Morin et al), and in an article in JAPAN DISPLAY '86 "A 6" Diagonal Active Matrix Addressed LCD for Minitel Application" by the same authors. The technology described in these documents is very economic since it can be used to make thin-film transistors with two levels of masks only, by making the data columns at the same time as the electrodes. Furthermore, an article by Y. Ugai et al "A 7.23-in.-Diagonal Color LCD Addressed by a-SI TFTs" (SID 84 DIGEST, page 308) suggests the production of a direct multilevel transistor made with three levels of masks.

However, these technologies have a number of disadvantages, the most important of which is due to photoconductivity of silicon. These transistors are sensitive to light from above, in other words through their edges, and the "dark mask" technology (gate fully covering the semiconductor material) is impossible. These transistors are also sensitive to light from below, in other words through the channel of the transistor in direct contact with the substrate when it is transparent. Moreover, an additional passivation step has to be introduced in the production method for these transistors, to prevent the semiconductor material from being exposed on the surface at the end of the process. Finally, a size limitation is that no gate-source contact is possible.

Solutions have been suggested to solve the problem of photoconductivity from below, for instance as described in HOSIDEN EP 186036 and EP 179915 patents, and in an article by T. Wada et al "1280×800 Color Pixel 15 inch Full Color Active Matrix LCD" (EURODISPLAY'90 The Tenth International Display Research Conference", page 370). These solutions require at least four mask levels and do not allow any gate-source or gate-drain contact. Furthermore, the only way of solving the problem of photoconductivity from above with these solutions is to deposit and etch an opaque mask on the counter-electrode.

This invention can overcome these disadvantages by means of an economic production method with three or four levels of masks.

This invention concerns production methods for direct multilevel thin-film transistors with four levels of masks that can be used in a liquid crystal screen; it is characterized by the following steps:
   deposit and etch a first conducting level on an insulating substrate in order to form a source and a drain,
   deposit and etch a semiconductor level alone or with a first insulator level joining source and drain,
   deposit and etch a second insulator level
   deposit and etch a second conducting level forming the transistor gate.

This invention also concerns a method for making direct multilevel thin-film transistors with three levels of masks that can be used in a liquid crystal screen; it is characterized by the following steps:
   deposit and etch a first conducting level on an insulating substrate in order to form a source and a drain,
   deposit a semiconductor level and an insulator level and etch the assembly joining source and drain,
   oxidation, nitriding, or passivation of the sides of the semiconductor level,
   deposit and etch a conducting level forming the transistor gate.

This method may be followed by an etching step on the double layer (semiconductor/insulator) level using the etched conducting level as a mask level, and an oxidation, nitriding or passivation step for the etched sides of the semiconductor level.

This invention also concerns a method of manufacturing a liquid crystal screen in which the active matrix transistors are made using this type of method.

Another purpose of this invention is an electronic circuit made on an insulating substrate by one of the embodiments of the method according to the invention.

The method according to the invention can be used to passivate transistors during the process, to make them insensitive to light from above, the bottom being protected by a black matrix, as described in French patent application No. 9112586 registered by the applicant.

The method according to the invention can be used to make integrated circuits on the same substrate as the active matrix owing to the possibility that it offers of connecting transistor gates to sources or drains of the same or other transistors, and thus be used in a "integrated drivers" technology. It is also possible to make different types of transistors and capacitances using this method, without adding any additional mask levels.

Figure 1B:
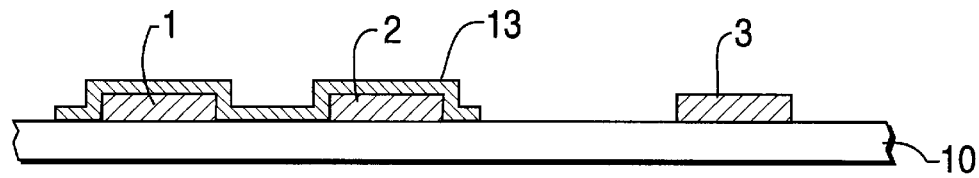
Figure 1C:
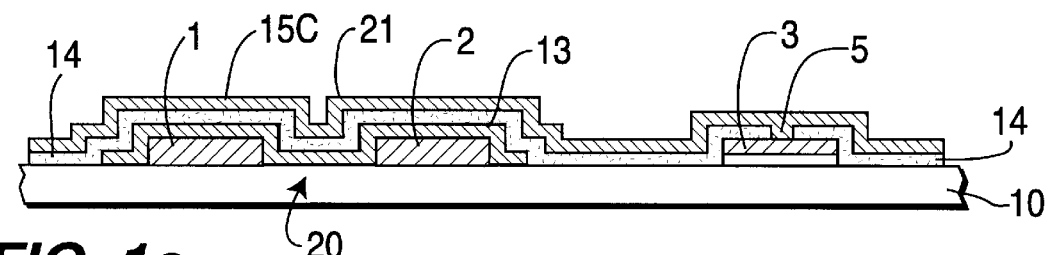
Figure 1D:
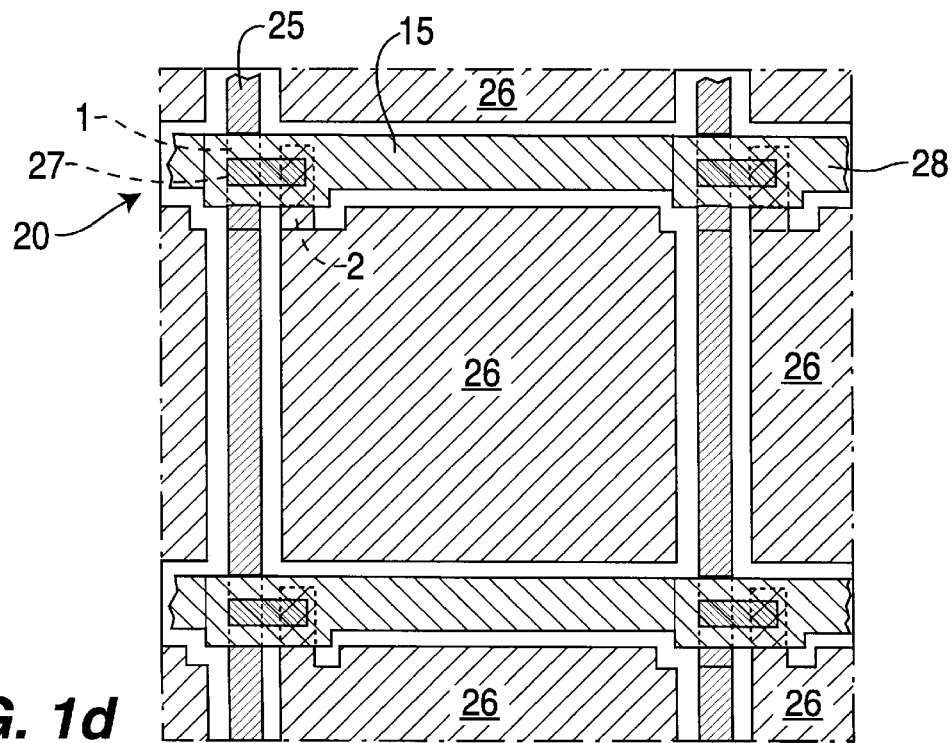
Figure 1E:
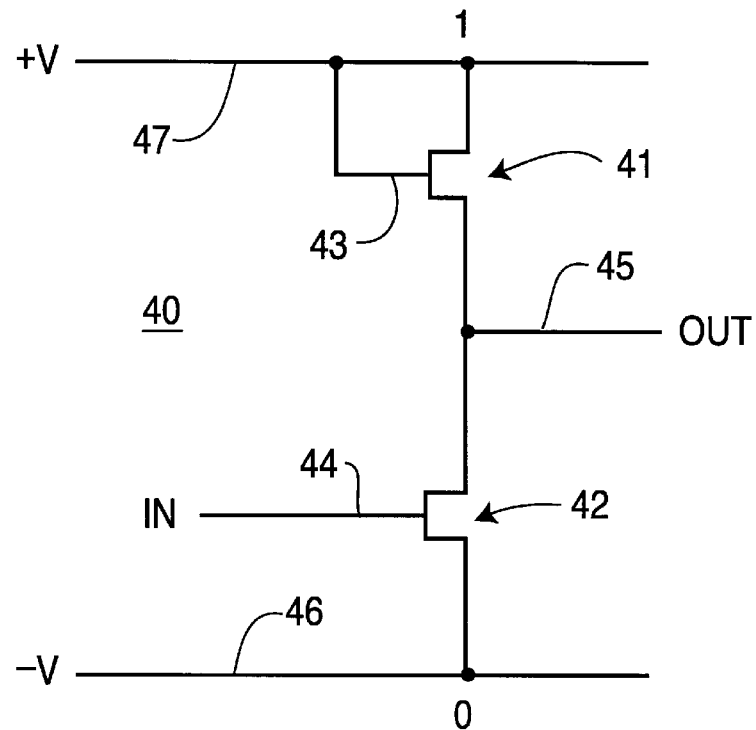
Figure 1F:
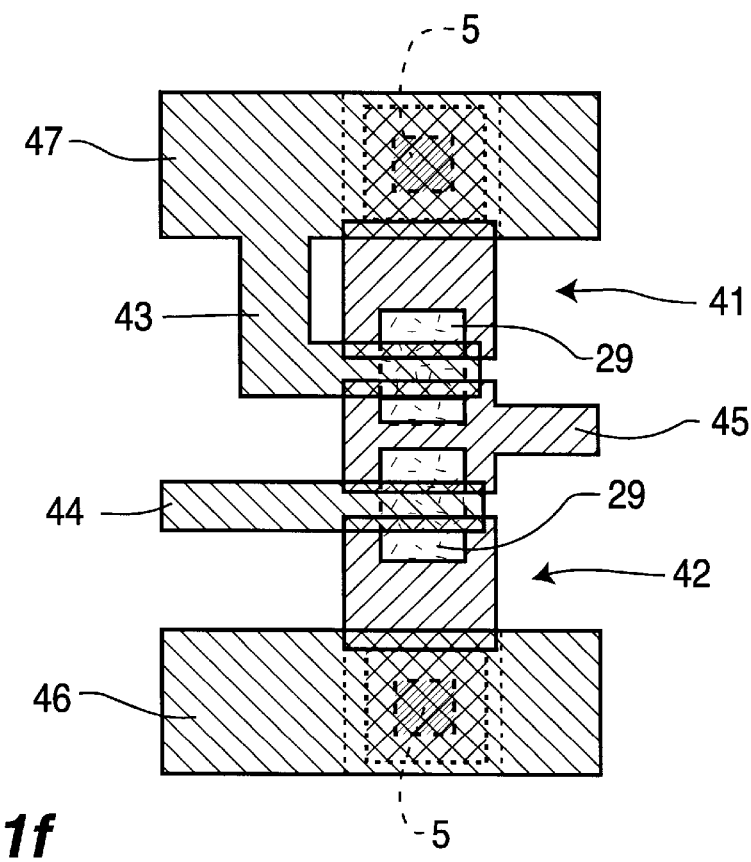
Figure 2A:
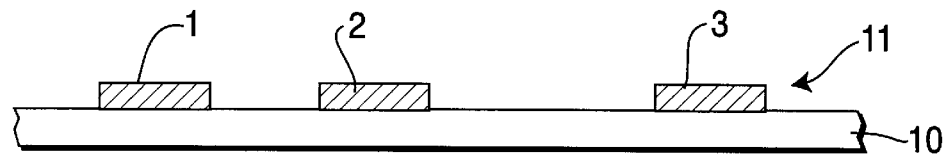
Figure 2B:
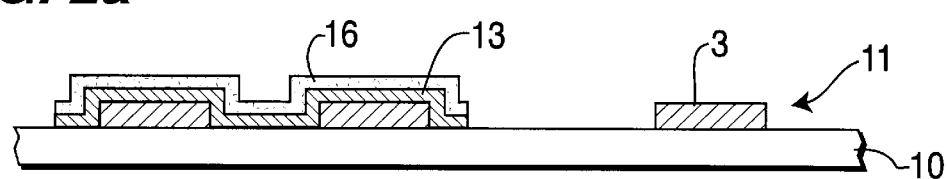
Figure 2C:
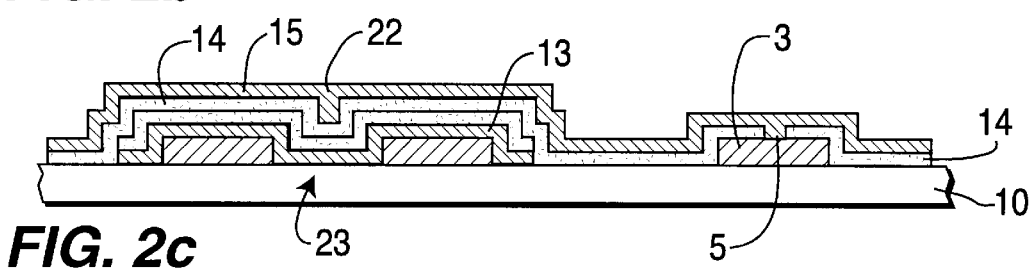
Figure 2D:
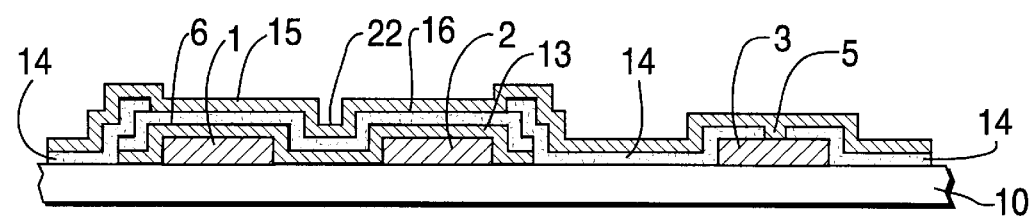
Figure 2E:
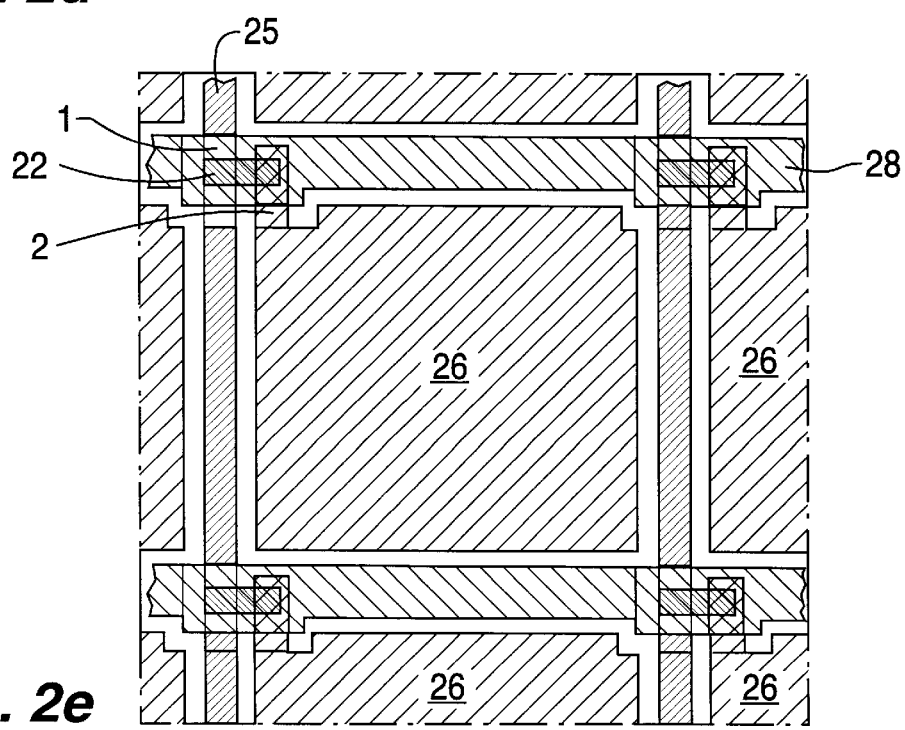
Figure 3A:
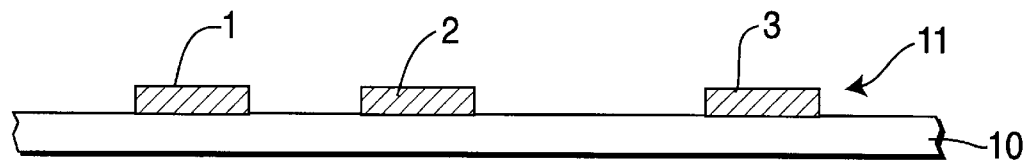
Figure 3B:
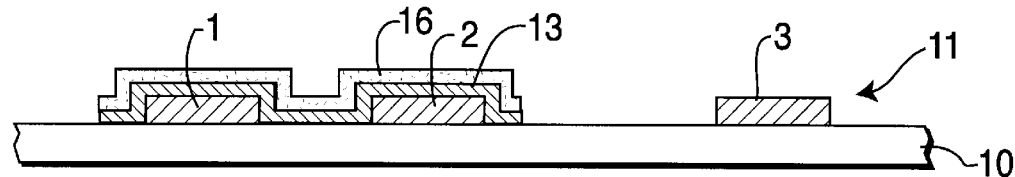
Figure 3C:
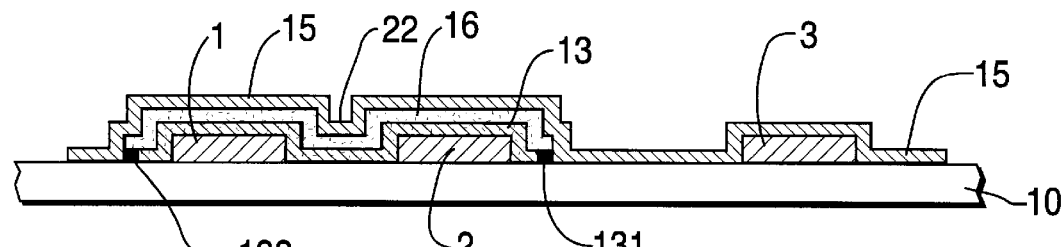
Figure 3D:
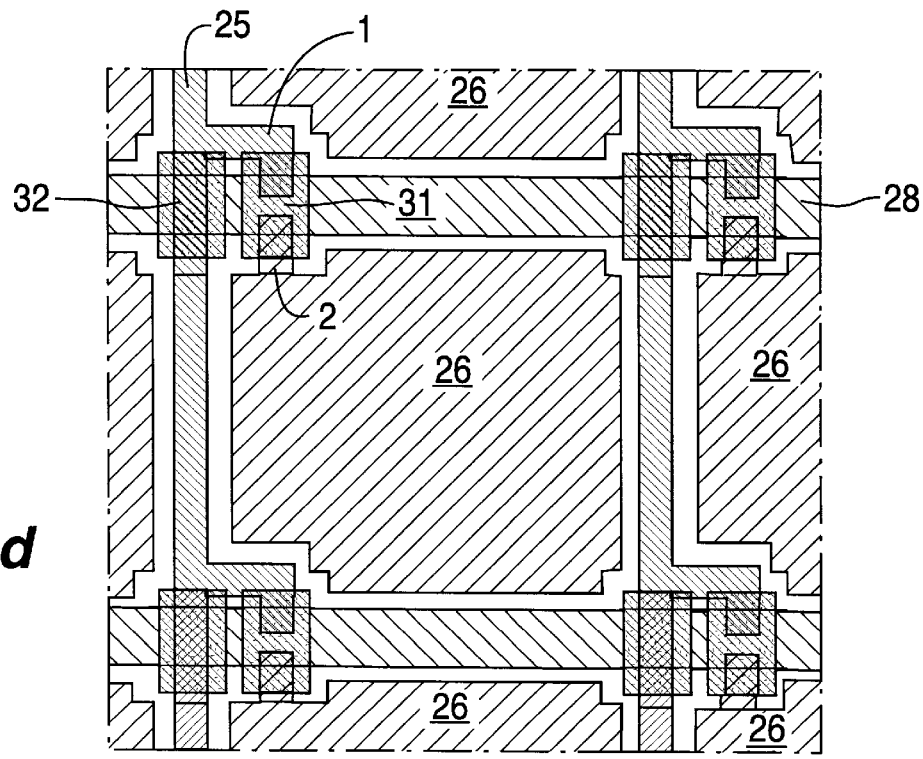

The invention will be better understood and other advantages and characteristics will become clear on reading the following description, making reference to the appended figures, of which:

FIGS. 1a to 1c represent a first embodiment of the method according to the invention, FIG. 1d shows a plane view of a part of an active matrix screen made using the method shown in FIGS. 1a to 1c, FIG. 1e shows the electrical block diagram for an inverter FIG. 1f shows the inverter in FIG. 1e made using the method in FIGS. 1a to 1c, FIGS. 2a to 2d show a second embodiment of the method according to the invention, FIG. 2e shows a plane view of part of an active matrix screen made using the method in FIGS. 2a to 2c, FIG. 2f shows a plane view of part of an active matrix screen made using the method in FIGS. 2a, 2b and 2d, FIG. 2g shows the inverter in FIG. 1e made using the method in FIGS. 2a to 2c, FIG. 2h shows the inverter in FIG. 1e made using the method in FIGS. 2a, 2b and 2d, FIGS. 3a to 3c show a third embodiment of the method according to the invention, FIG. 3d shows a plane view of part of an active matrix screen made using the method in FIGS. 3a to 3c, FIG. 3e shows the inverter in FIG. 1e made using the method in FIGS. 3a to 3c, The same references are used for the same elements and the same materials in these figures.

FIG. 1a represents an insulating and possibly transparent substrate 10, on which a layer 11 of a transparent conducting material or a double transparent conducting—doped semiconductor layer is deposited and etched during a first step, for example making the source 1 (data column), drain 2 (electrode) and an arbitrary interconnection 3. In a second step, this first level may be doped on the surface if it is not already doped to create a resistive contact between source 1 and drain 2. For example, this doping may be done using a "flash phosphine" type method consisting of depositing phosphorus on the transparent conductor 11 in a phosphorus and hydrogen plasma environment, distributing phosphorus in conductor 11 and in the semiconductor material 13 making the resistive contact between source 1 and drain 2 (FIG. 1b). This method is described in JAPAN DISPLAY'89 publication, page 506.

The third step illustrated in FIG. 1b consists in depositing and etching a semiconductor material 13 or a semiconducting multilayer in order to completely cover the first level 11, preferably overlapping mesas formed by these layers on each side.

The forth step of this first example of an embodiment of the method according to this invention is to deposit and then etch a layer 14 of a dielectric material such that a contact 5 can be made during the fifth step of the method.

In this fifth and final step, a layer 15 of a conducting material is deposited and then etched in order to make the gate 21 of the direct multilevel transistor 20 and to make a contact between this gate 21 and connection 3. This is shown in FIG. 2c, and includes four mask levels. For example, this connection 3 may be an internal connection between the gate and source.

This type of transistor thus obtained can be used in preference for making flat screens fitted with integral electronic control circuitry.

FIG. 1d shows part of an active matrix screen containing at least some of the direct multilevel transistors 20 made according to the method described above. This figure is described using one pixel, but the description is obviously applicable to all pixels arranged in a matrix.

During the first step in the method, the layer of transparent conducting material 11 is deposited on the insulating substrate 10. This transparent conducting material can be doped on the surface before or after etching so as to form data columns 25 corresponding to the source 1 of transistor 20, and pixel electrodes 26. In the example in this figure, these electrodes 26 are approximately square and are fitted with a pin 2 corresponding to drain 2 of transistor 20. Semiconductor 13 is deposited and then etched and forms a mesa joining source 1 (column 25) to drain 2 (pixel electrode 26). The dielectric 14 is then deposited over the entire surface in order to insulate the gate and is etched to create contacts 3 (not shown in the figure). Finally the conducting material 15 is deposited and then etched making rows 28 and contacts 3.

FIG. 1e shows the electrical block diagram for an inverter 40. This inverter includes two transistors 41 and 42 connected in series between the two +V (47) and −V (46) polarities. When a high IN signal arrives at 44 on the gate of transistor 42, it is made conducting. Since the gate of transistor 41 is connected (43) to the row with the +V polarity, this transistor becomes conducting and a low OUT signal is output from 45. Conversely, when a low signal is input in 44, transistor 42 becomes non conducting and a high signal is output at 45 of inverter 40.

This inverter 40, made according to a first embodiment of the method according to the invention is shown in FIG. 1f. The conducting material 11, preferably transparent and surface treated, is deposited and etched to form sources and drains of transistors 41 and 42, and the connection row 45. The semiconductor 13 is deposited and etched so as to form mesas 29 joining sources and drains. The insulator 14 is then deposited and etched so as to create an opening 5 at the external sources and drains of transistors 41 and 42 respectively. Conductor 15 is deposited and etched making contacts of gates 44 and 43, and the source-row contacts 47 (+V) and drain-row contacts 46 (−V).

This first embodiment of the method according to the invention reveals a constraint, which is that deposits of layer 13 of the thin semiconductor material 13 and the dielectric material 14 are not made during the same vacuum cycle. This can create a poor interface between these two materials when etching the semiconductor layer 13, which may degrade the electrical properties of the transistor. This disadvantage is avoided in the following embodiments of the method.

A second embodiment of the method according to the invention is shown in FIGS. 2a to 2d.

The first two steps (FIGS. 2a and 2b) are identical to the same steps in the previous method and correspond to a first mask level.

During the third step, the layer 13 of semiconductor material and layer 16 of a dielectric material are simultaneously deposited and etched, as shown in FIG. 2b. The fact that dielectric 16 and the semiconductor 13 are deposited and etched during the same vacuum cycle assures a good interface between the two layers.

The fourth step is to deposit a second dielectric layer 14 over the entire surface and to etch it so that a contact can be made between conducting layer 15 (deposited during the fifth and final step) corresponding to gate 22 and connection 3 and/or so that an opening 6 in the dielectric layer 14 brings the conducting level 15 and the insulator level 16 into contact on the island consisting of the sources and drains, the semiconductor 13 and insulator 16, the dielectric layer 14 now only covering the edges of the etched blocks formed by layers 11, 13 and 16. In this case, four masking levels are used.

Thus this method solves the problem of the poor interface mentioned above without adding any other steps, and can be used to make different types of transistors and capacitances for which the characteristics can be selected by an appropriate choice of dielectrics 14 and 16 and which are shown in FIGS. 2c and 2d.

A first type of transistor 23 is shown in FIG. 2c and uses the two dielectrics 14 and 16 as gate dielectric. This makes this type of transistor almost insensitive to "gate stress": this parasitic phenomenon is due to amorphous silicon when the gate is controlled with high voltages, the electric characteristics of the transistor degrading with time.

The second type of transistor 24 is shown in FIG. 2d and only uses dielectric 16 as a gate dielectric. This means that the transistor characteristics can be adjusted to lower voltages, this type of transistor being used for peripheral electronic control circuitry. Since the gate insulator is thinner, the current passing through the transistor is higher.

When integral electronic control circuitry is used, the active matrix transistors may be of the first type. The electronic control circuitry can use both types of transistors, so that it can be adapted to low voltage external signals compatible with current technology. Generally, the choice of two insulators 16 and 14 means that transistors of the first type only, or transistors of the second type only, or transistors of both types mixed, can be used.

In the same way, three different types of capacitances can be made using the same production method, using either layer 16 or layer 14 or both, as dielectric.

Furthermore, this type of method can provide a good production efficiency if the dielectric materials 14 and 16 are different, since defects in one will not be transmitted to the other.

FIG. 2e shows a part of an active matrix screen containing at least some of the transistors 23 made according to the second embodiment of the method according to FIGS. 2a, 2b and 2c. This figure is described using one pixel, but the description is obviously applicable to all other pixels arranged in a matrix.

During the first step in the method, the layer of transparent conducting material 11 is deposited on the insulating substrate 10. This transparent conducting material can be doped on the surface before or after etching so as to form data columns 25 corresponding to the source 1 of transistor 23, and pixel electrodes 26. In the example in this figure, these electrodes 26 are approximately square and are fitted with a pin 2 corresponding to drain 2 of transistor 23. Semiconductor 13 and the first dielectric 16 were deposited during the same vacuum cycle and etched together so as to form a mesa 27 joining column 25 to electrode 26, making source 1 and drain 2 respectively of transistor 23. The second layer of insulation 16 deposited over the entire surface and etched so as to create contact 5 in FIG. 2c between an arbitrary connection 3 and gate 22 of transistor 23, is not shown in the figure, nor is connection 3 shown. The addressing row 28 is obtained during the deposition and etching in the fifth step of the second embodiment of the method in FIGS. 2a, 2b and 2c. It may be in contact with connection 3, which for example could be the source or drain of a transistor of the integral electronic control circuitry, and completely cover the mesa 27 formed by the semiconductor 13 and the first insulator 16.

This type of transistor includes the two insulators 14 and 16 in FIG. 2c as the gate dielectric.

Similarly, FIG. 2f shows part of an active matrix made using the second embodiment of the method in FIGS. 2a, 2b and 2d, active matrix in which all or some of the transistors include the first insulator level 16 as gate dielectric (transistor 24 in FIG. 2d). There are the data columns 25 and arbitrarily shaped electrodes 26, but which include a pin which forms the drain 2 of transistor 24. The difference from the device in the previous figure is that at the time of the fourth step in the method, the second insulator level 14 was etched so that, in addition to creating a contact between addressing row 28 corresponding to gate 22 of transistor 24 and a connection 3 (not shown in the figure), the first insulation 16 alone forms the gate dielectric. This area 6 thus recessed in the second insulator 14 is preferably less than the area 29 occupied by the semiconductor 13 and the first insulator 16.

FIG. 2g shows the inverter 40 in FIG. 1e made using the second embodiment of the method according to the invention, comprising two transistors 41 and 42 of the first type. The explanation given in the description of FIG. 1e is still applicable, except that the mesas 29 are no longer composed of a semiconductor level 13, but now consist of a semiconductor level 13 etched at the same time as the first insulator level 16.

FIG. 2h shows the inverter 40 in FIGS. 1e and 2g made using the second embodiment of the method according to the invention including two transistors 41 and 42 of the second type. The difference from the previous figure is the opening 6 etched through the second insulator level 14.

Thus, two different types of transistors were made, capable of cohabiting on the same circuit, manufactured during the same process without adding an additional mask level, the gate of these transistors being connectable to a connection on the same circuit, as for example to the source or drain of a transistor with peripheral electronic control circuitry integrated into the screen.

Moreover, if there must not be a connection between gate 22 and connection 3 (simple intersection of two rows), one or both of the thicknesses may be chosen to isolate these conductors from each other.

Dielectric 14 is used to passivate the transistors, the electrode pixel, as gate insulator and as interconnection dielectric (insulation of two superimposed conducting layers).

A third embodiment of the method according to the invention includes the same first and second steps as in the previous methods as shown in FIG. 3a. The third step of this embodiment of the method according to the invention is to simultaneously deposit a layer 13 of a semiconductor material and a layer 16 of a dielectric material. These first two steps correspond to two mask levels.

The third step is to passivate areas 131 and 132 not protected by the dielectric on the sides of the semiconductor. This passivation may be done by oxidation (O, O2, O3, N2O plasma), or nitriding (N, NH3 plasma), or passivation (deposit of planarizing dielectric followed by anisotropic etching of the same dielectric). At this stage of the production method, the sides 131 and 132 of the semiconductor have to be protected to prevent gate-source leakages, since the gate and source are no longer protected by the dielectric layer as they were in the previous two embodiments of the method according to the invention. Then in a fourth step, a layer 15 of a conducting material is deposited and then etched forming a third mask level (FIG. 3c). In this case, the gate 22-connection 3 contact is made by direct contact between the conducting level 15 and the connection 3.

This third way may be extended by a fifth step consisting of etching dielectric layers 16 and the semiconductor material 13 using conductor 15 as a mask level. Areas of the semiconductor 13—insulator 16 mesa may be extended on each side of the etched conducting layer 15 (gate) in the plane perpendicular to the plane of the figure, and may be withdrawn using the required technology. A sixth step may then consist of passivation by oxidation or nitriding or by depositing a dielectric on the sides of the semiconductor not protected by dielectric 16.

Furthermore if there must be no contact between gate 22 and connection 3, a semiconductor 13-insulator 16 mesa may be left on the connection 3 in order to isolate the conducting level 15.

FIG. 3d shows part of an active matrix made using this third embodiment of the method according to the invention described from FIGS. 3a to 3c. An arbitrarily shaped electrode 26 includes a pin 2 forming the drain of transistor 30. At the same time as this electrode 26, a column 25 fitted with a tab facing drain 2 is etched to form the source 1 of transistor 30. During the second step in the method, the semiconductor 13 and the dielectric 16 are deposited and etched so as to form mesas 31 and 32, mesa 31 forming the semiconductor level of transistor 30, and mesa 32 forming an insulation level between column 25 and gate 28 deposited and etched during the fourth step of the method.

The sides of mesas 31 and 32 were passivated before depositing and etching gate 28. In this example, note that semiconducting-insulating mesas project over each side of the gate, and therefore do not have to be treated in the same way as in the fifth and sixth steps in the method above.

Figure 3E:
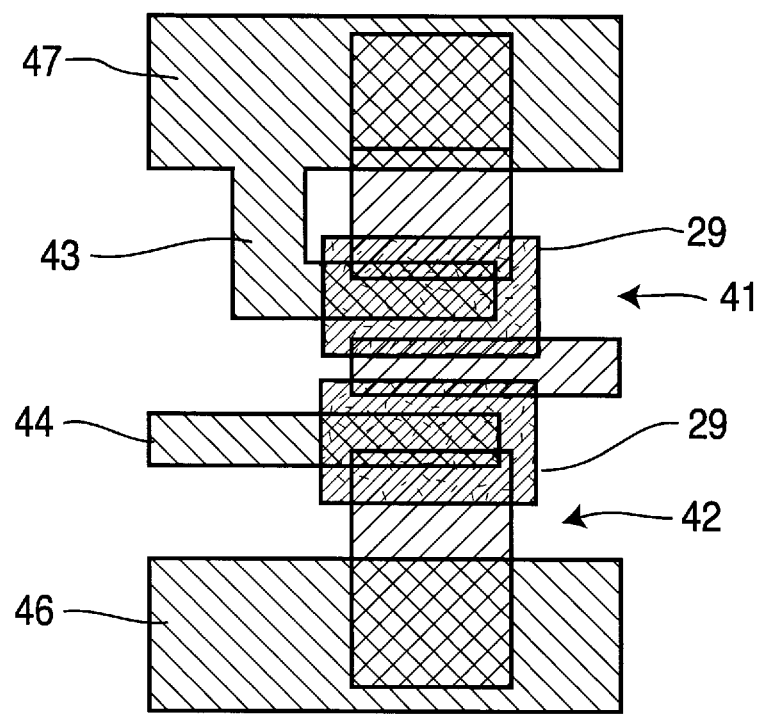

FIG. 3e shows the inverter 40 in FIG. 1e made according to the third embodiment of the method according to the invention. This therefore includes transistors 41 and 42, the first conducting level forming sources and drains of these transistors and the connection 45, mesas 29 the sides of which were passivated consisting of a first semiconductor level 13 and a first insulating level 16, and finally the metallic level 15 forming gates 43 and 44 of transistors 41 and 42, and connections 46 and 47.

In the second and third embodiments of the method according to the invention, the dielectric 16 deposited in the same vacuum cycle as semiconductor level 13 creates a good interface between these two levels.

The method according to the invention may be used on a glass substrate or on a previously preprocessed substrate (general layout drawing, black matrix and insulator level) which for example can add storage capacity and protect the transistor against the light from the back of the screen.

One particularly interesting improvement to the invention is to deposit and etch a first opaque level directly on the substrate at the beginning of the method, so that this level can mask the semiconductor channel between the source and the drain of each direct multilevel transistor. This first opaque level may be deposited and etched so as to mask the locations at which the sources, drains and semiconductors making up the transistors controlling pixel electrodes are deposited, from light, and to leave only areas containing electrodes exposed to the light, thus improving the screen contrast while preventing photoconductivity of the semiconductor materials used. This adds only one mask level to the method according to the invention. This level may be made of reflecting metal and, if it is conducting, this first etching must be followed by a deposit of an insulating layer over the entire surface of the substrate.

This type of first opaque level is called a black matrix and is described in detail in French patent application No. 91 12586 registered by the applicant.

Another improvement to this invention would be to add a storage capacitance on which the active matrix will be made directly onto the substrate at the beginning of the method. This type of storage capacitance is described in detail in French patent application No. 91 12585 registered by the applicant. This storage capacitance may be made on a transparent conducting layer deposited directly over the entire substrate and covered by a transparent insulating layer. Thus no new mask levels have been added. It may also be opaque and etched so as to mask only semiconductor layers or to allow light to pass only in areas including electrodes, thus acting as a black matrix.

Preferably, substrate 10 will be a glass plate, the transparent material and conductor 11 may be indium and tin oxide (ITO) or tin oxide (SnO2), and the semiconductor material 13 may be a multilayer or single layer of hydrogenated amorphous silicon (a-Si:H), or polycrystalline or microcrystalline silicon. Dielectric materials 14 and 16 may be silicon dioxide (SiO2), silicon nitride (SiN), or oxynitride. Preferably, the insulating layer in contact with the semiconductor is a layer of silicon nitride (SiN) and the layer in contact with the conductor is a layer of silicon dioxide (SiO2). Conducting materials 15 may be made of aluminum, titanium, chromium, molybdenum, tungsten, tantalum, ITO, alloys or multilayers.

This invention is applicable to the manufacture of thin-film transistors with a direct, self-passivated and self-shielded, multilevel structure that may be used for the manufacture of any type of electronic circuit (signal processing electronics) integrated on a substrate which may or may not be preprocessed, or on a glass plate based on amorphous silicon similar to plates used for photocopying or controlling photodiode modules, and more particularly for the manufacture of flat liquid crystal screens controlled by external or integral electronic control circuitry (drivers).

We claim:

1. A method for making direct multilevel thin-film transistors with three mask levels, comprising the steps of:

depositing and etching a first conducting level on an insulating substrate to form a source and a drain, depositing during the same step a semiconductor level followed by an insulator level and etching of the assembly joining source and drain, oxidizing, nitriding or passivating of edges of the semiconductor level, and depositing and etching a conducting level to form the transistor gate.

2. A method according to claim 1 wherein sources, drains and gates are etched to form columns, pixel electrodes and rows respectively, for an active matrix liquid crystal screen.

3. A method according to claim 1, wherein the transistors comprise integral electronic control circuitry and/or signal processing electronics.

4. A method according to claim 1, wherein the insulated substrate is transparent.

5. A method according to claim 1, wherein the first conducting level is transparent.

6. A method according to claim 1, wherein the first transparent conducting level is doped on the surface.

7. A method according to claim 1, wherein the first conducting level is a double doped semiconductor layer.

8. A method according to claim 1, wherein a conducting level is directly deposited on the insulating substrate followed by a deposit of an insulating layer, forming the electrode and dielectric of a storage capacitance.

9. A method according to claim 1, wherein the substrate (10) is a glass plate.

10. A method according to claim 1, wherein the first transparent conducting level is composed of indium and tin oxide, or tin oxide.

11. A method according to claim 1, wherein the semiconductor materials are made of hydrogenated amorphous silicon, polycrystalline, or microcrystalline silicon.

12. A method according to claim 1, wherein the insulating materials are made of silicon dioxide, silicon nitride, or oxynitride.

13. A method according to claim 1, wherein conducting materials are made of aluminum, titanium, chromium, molybdenum, tungsten, tantalum, indium and tin oxide, alloys or multilayers.

* * * * *